United States Patent
Lin

(10) Patent No.: US 10,671,195 B2
(45) Date of Patent: Jun. 2, 2020

(54) DISPLAY DEVICE AND OPERATING METHOD THEREOF

(71) Applicant: AU OPTRONICS CORPORATION, Hsin-chu (TW)

(72) Inventor: Chen-Chi Lin, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 184 days.

(21) Appl. No.: 15/848,842

(22) Filed: Dec. 20, 2017

(65) Prior Publication Data

US 2018/0335881 A1 Nov. 22, 2018

(30) Foreign Application Priority Data

May 19, 2017 (TW) .............................. 106116749 A

(51) Int. Cl.
| | |
|---|---|
| *G06F 3/041* | (2006.01) |
| *G06F 3/044* | (2006.01) |
| *G09G 3/3258* | (2016.01) |
| *G09G 3/00* | (2006.01) |
| *G09G 3/3266* | (2016.01) |

(Continued)

(52) U.S. Cl.
CPC ............ *G06F 3/0412* (2013.01); *G06F 3/044* (2013.01); *G06F 3/0416* (2013.01); *G09G 3/006* (2013.01); *G09G 3/3258* (2013.01); *H01L 27/3276* (2013.01); *G09G 3/3266* (2013.01); *G09G 3/3275* (2013.01); *G09G 2330/021* (2013.01); *G09G 2330/12* (2013.01); *H01L 27/323* (2013.01)

(58) Field of Classification Search
CPC ...... G06F 3/0412; G06F 3/044; G06F 3/0416; G09G 3/3258; G09G 3/006; G09G 3/3275; G09G 3/3266; G09G 2330/021; G09G 2330/12; H01L 27/3276; H01L 27/323

See application file for complete search history.

(56) References Cited

U.S. PATENT DOCUMENTS

| | | | |
|---|---|---|---|
| 9,645,662 B2 | 5/2017 | Yang | |
| 9,746,979 B2 | 8/2017 | Yang | |

(Continued)

FOREIGN PATENT DOCUMENTS

| | | |
|---|---|---|
| CN | 104575382 A | 4/2015 |
| CN | 204440372 U | 7/2015 |

(Continued)

*Primary Examiner* — Temesghen Ghebretinsae
*Assistant Examiner* — Ivelisse Martinez Quiles
(74) *Attorney, Agent, or Firm* — Tim Tingkang Xia, Esq.; Locke Lord LLP

(57) ABSTRACT

An operating method of a display device includes: forming a plurality of capacitors between a plurality of monitor lines of a display device and a plurality of power lines of the display device via a plurality of light-emitting diodes; and performing touch sensing by using the capacitors. The light-emitting diodes are arranged in a matrix. A plurality of control switches of the display device is arranged in the matrix, and is electrically coupled to a plurality of first terminals of the light-emitting diodes, respectively. The monitor lines are electrically coupled to the first terminals of the light-emitting diodes, respectively. The power lines are electrically coupled to a plurality of second terminals of the light-emitting diodes, respectively.

11 Claims, 9 Drawing Sheets

(51) Int. Cl.
*G09G 3/3275* (2016.01)
*H01L 27/32* (2006.01)

(56) References Cited

U.S. PATENT DOCUMENTS

| | | | |
|---|---|---|---|
| 2013/0069853 A1* | 3/2013 | Choi | H01L 27/3276 345/80 |
| 2013/0293499 A1* | 11/2013 | Chang | G06F 3/041 345/173 |
| 2014/0225838 A1* | 8/2014 | Gupta | G06F 3/0412 345/173 |
| 2014/0240618 A1 | 8/2014 | Oraw | |
| 2015/0339978 A1 | 11/2015 | Nathan et al. | |
| 2016/0041668 A1* | 2/2016 | Chaji | G06F 3/044 345/174 |
| 2016/0140899 A1* | 5/2016 | Jeong | G09G 3/3225 345/212 |
| 2017/0031485 A1* | 2/2017 | Kim | G06F 3/0412 |
| 2017/0123541 A1* | 5/2017 | Omata | G06F 3/044 |
| 2017/0147121 A1* | 5/2017 | Yang | G06F 3/044 |
| 2018/0210591 A1 | 7/2018 | Chaji | |
| 2018/0239488 A1* | 8/2018 | Lin | G06F 3/0416 |

FOREIGN PATENT DOCUMENTS

| | | |
|---|---|---|
| CN | 105247462 A | 1/2016 |
| CN | 106409218 A | 2/2017 |
| TW | 201704959 A | 2/2017 |

\* cited by examiner

DISPLAY DEVICE AND OPERATING METHOD THEREOF

CROSS-REFERENCE TO RELATED PATENT APPLICATION

This application claims priority to and the benefit of, pursuant to 35 U.S.C. § 119(a), patent application Serial No. 106116749 filed in Taiwan on May 19, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electronic device and a method. Specifically, the present invention relates to a display device and an operating method thereof.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of science and technology, display devices are widely applied in people's life.

In some applications, a display device may have a touch sensing function. However, such a touch sensing function needs to be performed by using a capacitor. Therefore, how to appropriately dispose a capacitor in a display device is an important topic in this field.

SUMMARY

An implementation aspect of the present invention relates to a display device. According to an embodiment of the present invention, the display device comprises: a plurality of light-emitting diodes, a plurality of control switches, a plurality of monitor lines, and a plurality of power lines. The light-emitting diodes are arranged in a matrix. The control switches are arranged in the matrix, and are electrically coupled to a plurality of first terminals of the light-emitting diodes, respectively. The monitor lines are electrically coupled to the first terminals of the light-emitting diodes through the control switches, respectively. The power lines are electrically coupled to a plurality of second terminals of the light-emitting diodes, respectively. A touch sensing circuit is electrically coupled to the light-emitting diodes, and is used to receive one or more touch sensing voltages by using the first terminals or the second terminals of the light-emitting diodes.

Another implementation aspect of the present invention relates to a display device. According to an embodiment of the present invention, the display device comprises: a plurality of light-emitting diodes, a plurality of control switches, a plurality of monitor lines, a plurality of power lines, a plurality of first contact pads, and a plurality of second contact pads. The light-emitting diodes are disposed in a display area of the display device. The control switches are disposed in the display area of the display device, and are electrically coupled to a plurality of first terminals of the light-emitting diodes, respectively. The monitor lines are disposed in parallel to each other, and are electrically coupled to the first terminals of the light-emitting diodes through the control switches, respectively. The power lines are disposed in parallel to each other, and are electrically coupled to a plurality of second terminals of the light-emitting diodes, respectively. The first contact pads are disposed in a non-display area of the display device, and are electrically coupled to the monitor lines. The second contact pads are disposed in the non-display area of the display device, and are electrically coupled to the power lines.

Another implementation aspect of the present invention relates to an operating method of a display device. According to an embodiment of the present invention, the method comprises: forming a plurality of capacitors between a plurality of monitor lines of a display device and a plurality of power lines of the display device via a plurality of light-emitting diodes; and performing touch sensing by using the capacitors. The light-emitting diodes are arranged in a matrix. A plurality of control switches of the display device is arranged in the matrix, and is electrically coupled to a plurality of first terminals of the light-emitting diodes, respectively. The monitor lines are electrically coupled to the first terminals of the light-emitting diodes, respectively. The power lines are electrically coupled to a plurality of second terminals of the light-emitting diodes, respectively.

By means of the foregoing embodiments of this application, a capacitor may be formed via a light-emitting diode, so as to perform touch sensing.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The spirit of the present disclosure is described clearly below with reference to the accompanying drawings and detailed description. Any person of ordinary skill in the art may understand the embodiments of the present disclosure and then make variations and modifications according to the technologies provided in the present disclosure, and these variations and modifications do not depart from the spirit and scope of the present disclosure.

The terms "first", "second" and the like as used herein are used for distinguishing between similar elements or operations and not necessarily for describing a sequence, either temporally, spatially, in ranking or in any other manner, but are not used to limit the present invention.

As used herein, "electrically coupled" may mean that two or more elements are either in direct physical or electrical contact, or that two or more elements are not in direct contact with each other but yet still co-operate or interact with each other.

The terms "comprise", "include", "have" and "contain" as used herein are all open terms, that is, mean "including, but not limited to".

The term "and/or" as used herein includes any or all combinations of the objects described.

The directional terms "upper", "lower", "left", "right", "front", "back" and the like as used herein refer to the directions as seen in the accompanying drawings. Therefore, the directional terms as used herein are intended to illustrate rather than limit the present invention.

Unless otherwise specified, all the terms as used herein generally have the same meaning as is commonly understood by persons skilled in the art. Some terms used for describing the disclosure will be discussed below or in other parts of this specification, so as to provide additional guidance for persons skilled in the art in addition to the description of the disclosure.

Figure 1:
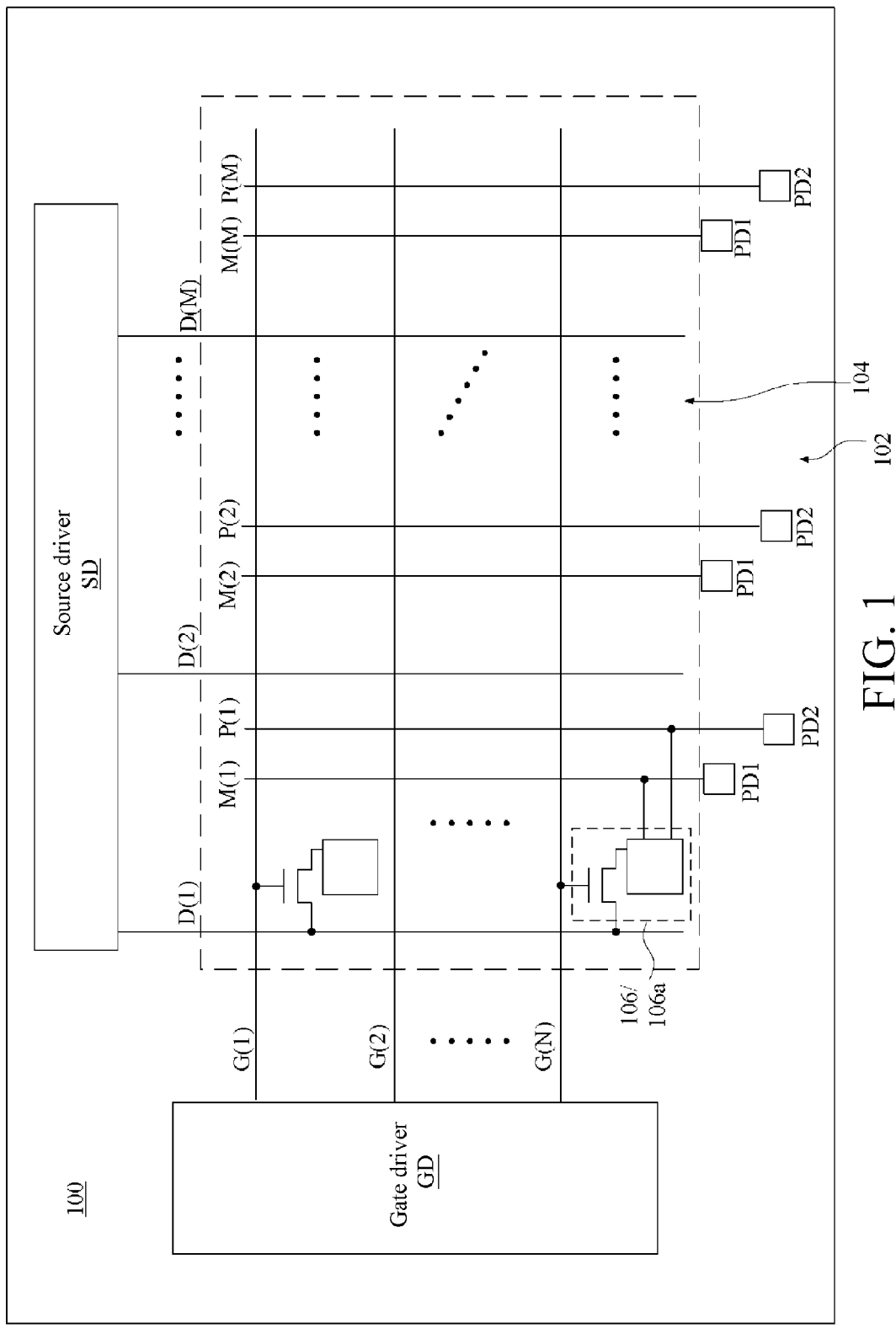
FIG. 1 is a schematic diagram of a display device according to an embodiment of the present invention.

FIG. 1 is a schematic diagram of a display device 100 according to an embodiment of the present invention. In this embodiment, the display device 100 may be a touch display device, but is not limited thereto. In this embodiment, the display device 100 may be an organic light-emitting diode display device, but is not limited thereto.

In this embodiment, the display device 100 includes a plurality of contact pads PD1, a plurality of contact pads PD2, data lines D(1), D(2), . . . , and D(M), gate lines G(1), G(2), . . . , and G(N), monitor lines M(1), M(2), . . . , and M(M), power lines P(1), P(2), . . . , and P(M), a source driver SD, a gate driver GD, and a plurality of pixel circuits 106/106a.

In this embodiment, the pixel circuits 106/106a are arranged in a display area 104 of the display device 100 in a matrix form. The source driver SD and the gate driver GD are disposed in a non-display area 102 of the display device 100. The contact pads PD1 and the contact pads PD2 are disposed in the non-display area 102 of the display device 100.

In this embodiment, the gate driver GD is electrically coupled to the gate lines G(1), G(2), . . . , and G(N). In this embodiment, the source driver SD is electrically coupled to the data lines D(1), D(2), . . . , and D(M).

Figure 1A:
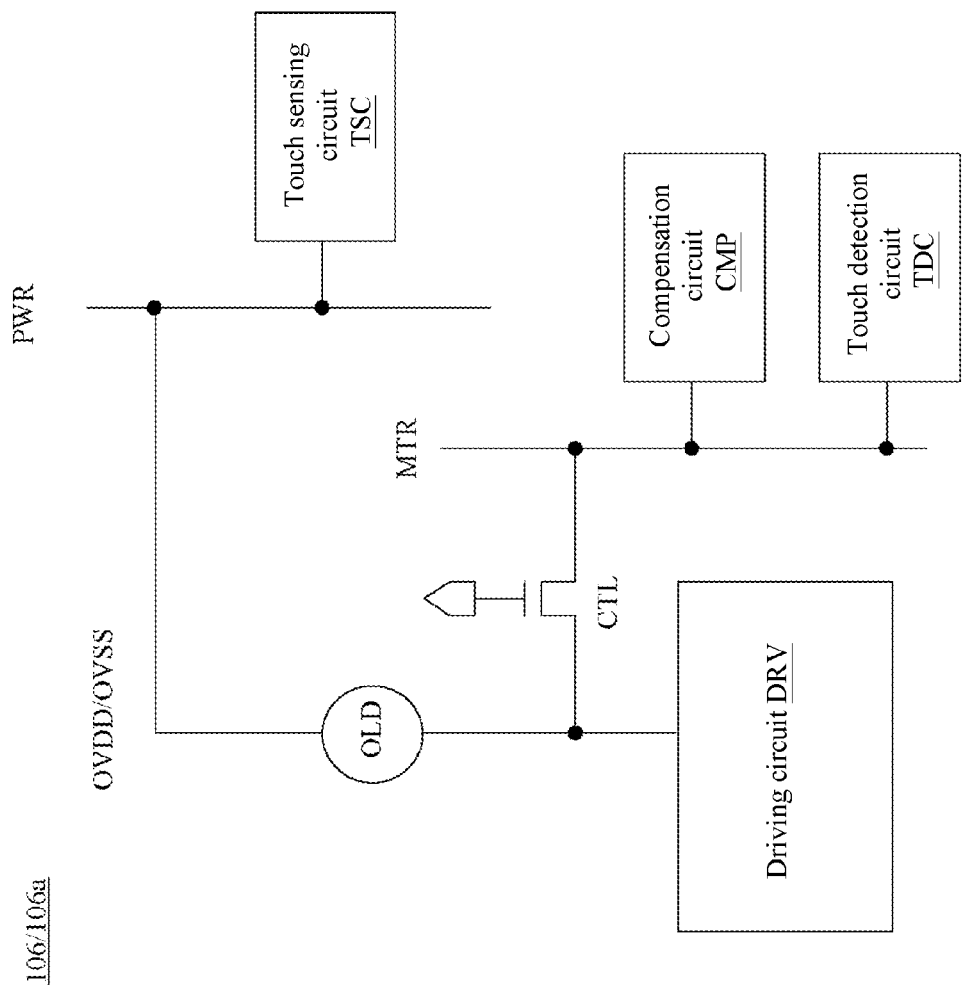
FIG. 1A is a schematic diagram of a pixel circuit according to an embodiment of the present invention.

In this embodiment, the monitor lines M(1), M(2), . . . , and M(M) are disposed in parallel to each other, and are electrically coupled to the pixel circuits 106/106a, the contact pads PD1, and a compensation circuit (a compensation circuit CMP shown in FIG. 1A). In this embodiment, the power lines P(1), P(2), . . . , and P(M) are disposed in parallel to each other, and are electrically coupled to the pixel circuits 106/106a and the contact pads PD2. In this embodiment, the contact pads PD1 may be electrically coupled to one of a touch detection circuit (a touch detection circuit TDC shown in FIG. 1A) and a touch sensing circuit (a touch sensing circuit TSC shown in FIG. 1A). For example, one of the touch detection circuit TDC and the touch sensing circuit TSC may be disposed on the contact pads PD1. In this embodiment, the contact pads PD2 may be electrically coupled to the other one of the touch detection circuit TDC and the touch sensing circuit TSC. For example, the other one of the touch detection circuit TDC and the touch sensing circuit TSC may be disposed on the contact pads PD2. In an embodiment, the touch detection circuit TDC and the touch sensing circuit TSC may be integrated into a single touch circuit. As used herein, engineering limitations should be considered for the terms such as "parallel" and "perpendicular". Unless otherwise indicated (for example, "completely" parallel), the actual meanings of "parallel" and "perpendicular" may be substantially parallel and approximately parallel. In addition, similarly, during interpretation of other terms, limitations on tolerance or precision in engineering practice or science and technology should also be considered.

In this embodiment, the monitor lines M(1), M(2), . . . , and M(M) are parallel to the power lines P(1), P(2), . . . , and P(M). However, in a different embodiment, the monitor lines M(1), M(2), . . . , and M(M) may be perpendicular to the power lines P(1), P(2), . . . , and P(M). Therefore, the present invention is not limited to the foregoing embodiment.

Refer to FIG. 1A at the same time. In an embodiment, the pixel circuit 106/106a may include a light-emitting diode OLD (for example, the light-emitting diode OLD may be an organic light-emitting diode OLD; however, another light-emitting diode also falls within the scope of the present invention), a control switch CTL, and a driving circuit DRV. The pixel circuits 106/106a are arranged in a matrix. Therefore, light-emitting diodes OLD are also arranged in a matrix, and control switches CTL are also arranged in a matrix. An end of the light-emitting diode OLD is electrically coupled to a power line PWR. The other end of the light-emitting diode OLD is electrically coupled to the driving circuit DRV, and is electrically coupled to a monitor line MTR through the control switch CTL. The power line PWR may be one of the power lines P(1), P(2), . . . , and P(M), and the monitor line MTR may be one of the monitor lines M(1), M(2), . . . , and M(M).

In this embodiment, the display device 100 may alternately perform a display operation and a touch sensing operation.

Figure 2:
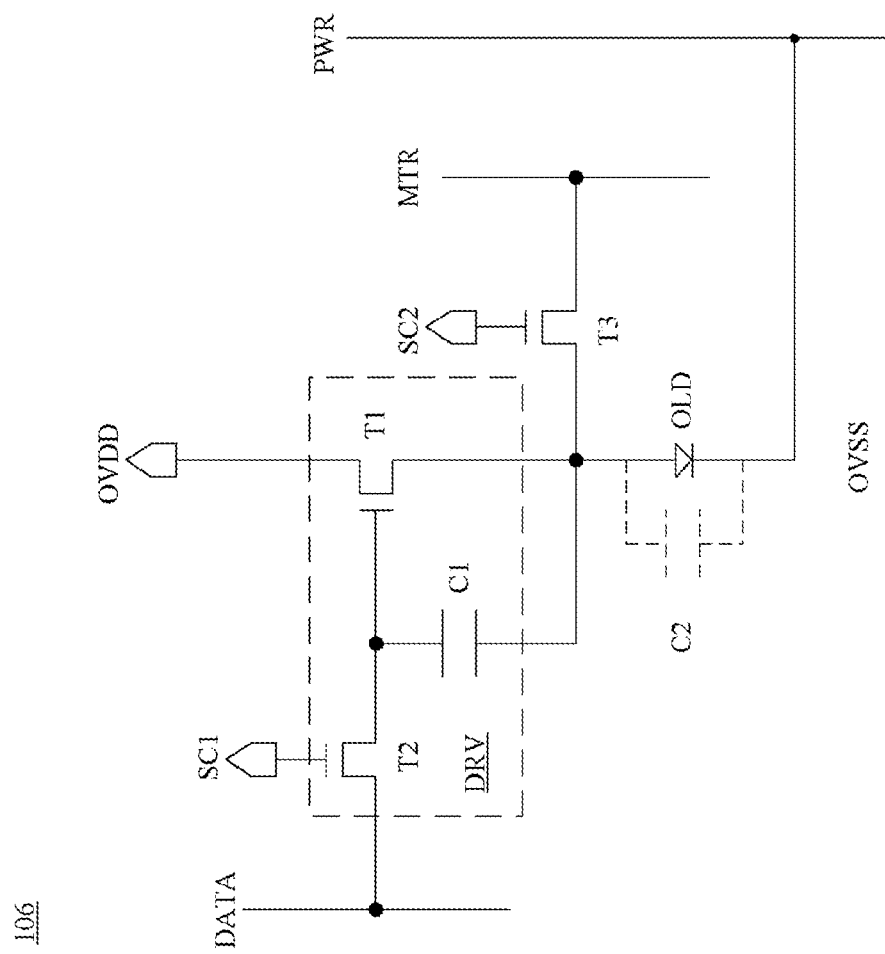
FIG. 2 is a schematic diagram of a pixel circuit according to an embodiment of the present invention.
Figure 6:
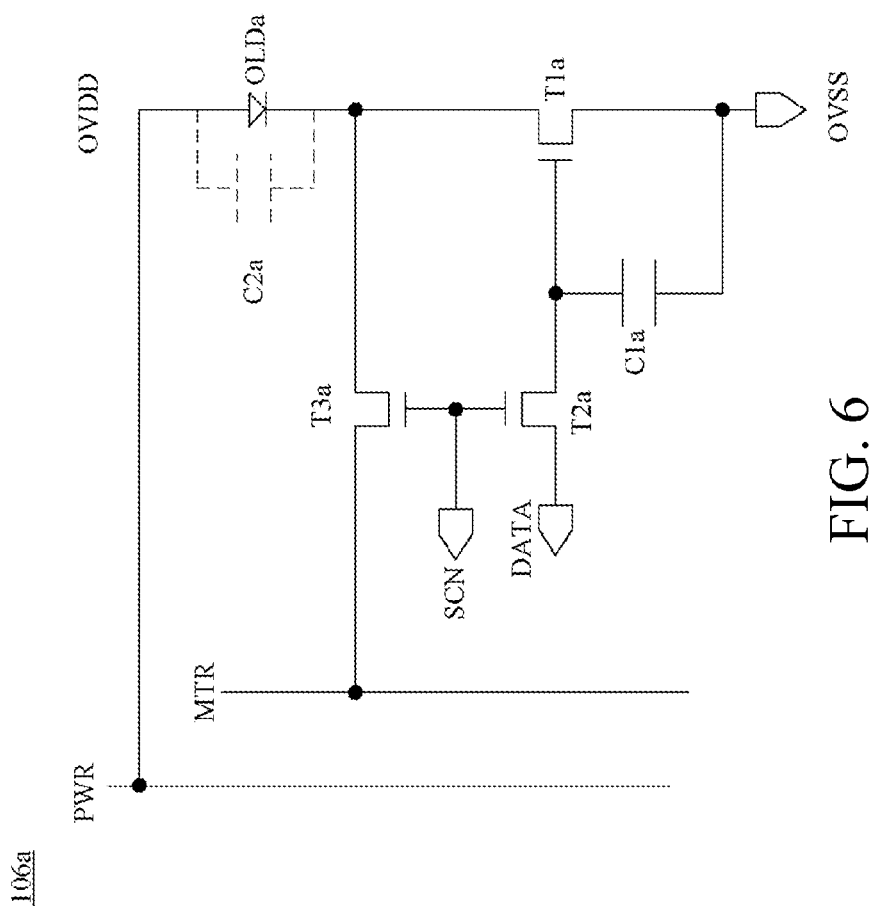
FIG. 6 is a schematic diagram of a pixel circuit according to another embodiment of the present invention.

In the display operation, the gate driver GD provides scanning signals to the driving circuits DRV of the pixel circuits 106/106a row by row through the gate lines G(1), G(2), . . . , and G(N) to turn on switch transistors of the driving circuits DRV row by row (a transistor T2 shown in FIG. 2 or a transistor T2a shown in FIG. 6). The source driver SD provides, respectively through the data lines D(1), D(2), . . . , and D(M), data voltages to the pixel circuits 106/106a that are turned on by the switch transistors, to enable the driving circuits DRV of the pixel circuits 106/

106a to drive, corresponding to the data voltages, the light-emitting diode OLD to perform display.

Moreover, during the display operation, the monitor line MTR may be used to monitor a voltage at an end of the light-emitting diode OLD, and provides the voltage at the end of the light-emitting diode OLD to the compensation circuit CMP, to enable the compensation circuit CMP to perform compensation for the display operation of the pixel circuits 106/106a. Moreover, the power line PWR may provide a supply voltage OVDD/OVSS to the other end of the light-emitting diode OLD, to enable the light-emitting diode OLD to perform display corresponding to the supply voltage.

In another aspect, during a touch sensing operation, when the control switch CTL is turned on, a capacitor may be formed between the power line PWR and the monitor line MTR via a light-emitting diode OLD, so as to perform touch sensing.

For example, in an embodiment, during a touch sensing operation, one of the monitor line MTR and the power line PWR is used to receive a touch detection voltage from the touch detection circuit TDC, and provide the touch detection voltage to an anode terminal or a cathode terminal of the light-emitting diode OLD. The other one of the monitor line MTR and the power line PWR is used to provide, corresponding to the touch detection voltage, one or more touch sensing voltages to a touch sensing circuit TSC, so as to perform touch sensing. In an embodiment, the touch detection voltage may be, for example, a pulse. When the light-emitting diode OLD that receives the touch detection voltage or the capacitor that is formed in the light-emitting diode OLD is touched, the light-emitting diode OLD or the capacitor that is formed in the light-emitting diode OLD generates a touch sensing voltage according to the touch detection voltage. Details are described in the following embodiments.

It should be noted that, in FIG. 1A, for example, the touch sensing circuit TSC is electrically coupled to the power line PWR, and the touch detection circuit TDC is electrically coupled to the monitor line MTR. However, substantially, in a different embodiment, the touch sensing circuit TSC may be electrically coupled to the monitor line MTR, and the touch detection circuit TDC may be electrically coupled to the power line PWR. Therefore, the present invention is not limited to FIG. 1A. In other words, the touch detection voltage may be sent from the monitor line MTR or from the power line PWR. In addition, although the touch sensing circuit TSC and the touch detection circuit TDC have different names, in common practice, the two circuits may be integrally disposed in one entity (for example, packaged in a same integrated circuit). However, this does not affect the fact that the entity has equivalent functions or circuits of the touch sensing circuit TSC and the touch detection circuit TDC.

Refer to FIG. 2. In an embodiment, the pixel circuit 106 includes transistors T1 to T3, a capacitor C1, and a light-emitting diode OLD. The transistor T3 may be used as the control switch CTL, and the transistors T1 and T2 and the capacitor C1 may be used as the driving circuit DRV.

In this embodiment, a first terminal of the transistor T1 is used to receive a supply voltage OVDD, and a second terminal of the transistor T1 is electrically coupled to the anode terminal of the light-emitting diode OLD.

In this embodiment, a first terminal of the transistor T2 is electrically coupled to a data line DATA. The data line DATA may be one of the data lines D(1), D(2), . . . , and D(M). A second terminal of the transistor T2 is electrically coupled to a control terminal of the transistor T1, and a control terminal of the transistor T2 is used to receive a scanning signal SC1. The scanning signal SC1 may be provided by one of the gate lines G(1), G(2), . . . , and G(N).

In this embodiment, a first terminal of the transistor T3 electrically coupled to the second terminal of the transistor T1, a second terminal of the transistor T3 is used to electrically coupled to the monitor line MTR, and a control terminal of the transistor T3 is used to receive a scanning signal SC2.

In this embodiment, two ends of the capacitor C1 are electrically coupled to the control terminal of the transistor T1 and the second terminal of the transistor T1, respectively. In this embodiment, the cathode terminal of the light-emitting diode OLD is used to be electrically coupled to the power line PWR, so as to receive a supply voltage OVSS during the display operation.

In this embodiment, a capacitor C2 may be formed between the monitor line MTR and the power line PWR via the light-emitting diode OLD, so as to perform touch sensing. In an embodiment, the capacitor C2 may be formed between an anode and a cathode of the light-emitting diode OLD.

It should be noted that, a pixel circuit 106 having another structure also falls within the scope of the present invention. The present invention is not limited to the foregoing embodiment.

Figure 3:
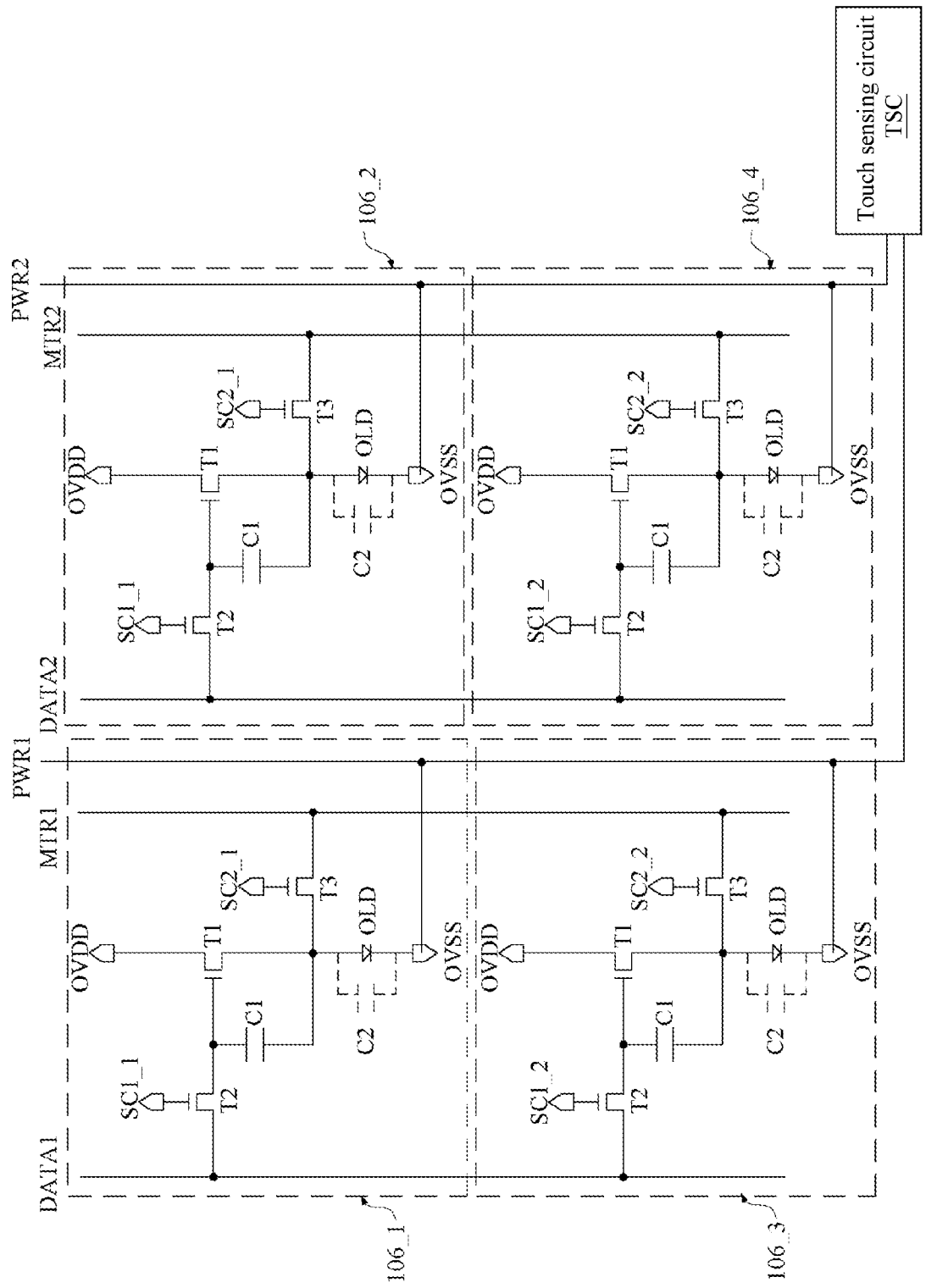
FIG. 3 is a schematic diagram of multiple pixel circuits according to an embodiment of the present invention.

Refer to FIG. 3. In this embodiment, pixel circuits 106_1 to 106_4 are adjacent four of the pixel circuits 106 in FIG. 1, and all have the structure of the pixel circuit 106 in FIG. 2. The pixel circuits 106_1 and 106_2 are in a same row, the pixel circuits 106_3 and 106_4 are in a same row, the pixel circuits 106_1 and 106_3 are in a same column, and the pixel circuits 106_2 and 106_4 are in a same column. The pixel circuits 106_1 to 106_4 are used as an example to describe the operation of the display device 100 in the following paragraphs.

In this embodiment, data lines DATA1 and DATA2 are adjacent two of the data lines D(1), D(2), . . . , and D(M). In this embodiment, the monitor lines MTR1 and MTR2 are adjacent two of the monitor lines M(1), M(2), . . . , and M(M). In this embodiment, the power lines PWR1, PWR2 are adjacent two of the power lines P(1), P(2), . . . , and P(M).

In this embodiment, the data line DATA1 is electrically coupled to first terminals of transistors T2 of the pixel circuits 106_1 and 106_3 at the same time, and the data line DATA2 is electrically coupled to first terminals of transistors T2 of the pixel circuits 106_2 and 106_4 at the same time. In this embodiment, the monitor line MTR1 is electrically coupled to second terminals of transistors T3 of the pixel circuits 106_1 and 106_3 at the same time, and the monitor line MTR2 is electrically coupled to second terminals of transistors T3 of the pixel circuits 106_2 and 106_4 at the same time. In this embodiment, the power line PWR1 is electrically coupled to cathode terminals of light-emitting diodes OLD of the pixel circuits 106_1 and 106_3 at the same time, and the power line PWR2 is electrically coupled to cathode terminals of light-emitting diodes OLD of the pixel circuits 106_2 and 106_4 at the same time.

In this embodiment, a scanning signal SC1_1 is provided to control terminals of the transistors T2 of the pixel circuits 106_1 and 106_2 at the same time, and a scanning signal SC1_2 is provided to control terminals of the transistors T2 of the pixel circuits 106_3 and 106_4 at the same time. In this embodiment, a scanning signal SC2_1 is provided to control terminals of the transistors T3 of the pixel circuits 106_1 and 106_2 at the same time, and a scanning signal SC2_2 is provided to control terminals of the transistors T3 of the pixel circuits 106_3 and 106_4 at the same time.

In this embodiment, the scanning signals SC2_1 and SC2_2 turn on the transistors T3 of the pixel circuits 106 row by row, so that in the pixel circuits 106 having the transistor T3 that are turned on, the light-emitting diodes OLD of the pixel circuits 106 are used as capacitors, so as to perform touch sensing.

For example, (in this example for description, the touch sensing circuit TSC is electrically coupled to the power lines PWR1 and PWR2), when the scanning signal SC2_1 turns on the transistors T3 of the pixel circuits 106_1 and 106_2 and the scanning signal SC2_2 turns off the transistors T3 of the pixel circuits 106_3 and 106_4, the monitor lines MTR1 and MTR2 may provide a touch detection voltage to the anode terminals of the light-emitting diodes OLD of the pixel circuits 106_1 and 106_2, and the power lines PWR1, PWR2 may provide, corresponding to the touch detection voltage, a touch sensing voltage to the touch sensing circuit TSC. For example, when a touch occurs on the light-emitting diode OLD of the pixel circuit 106_1, the power line PWR1 may correspondingly provide the touch sensing voltage to the touch sensing circuit TSC, so that the touch sensing circuit TSC learns a position (for example, on the light-emitting diode OLD of the pixel circuit 106_1) where the touch occurs at this time (when the transistors T3 of the pixel circuits 106_1 and 106_2 are turned on), and accordingly acquire the coordinates of the touch that occurs.

In addition, when the scanning signal SC2_1 turns off the transistors T3 of the pixel circuits 106_1 and 106_2 and the scanning signal SC2_2 turns on the transistors T3 of the pixel circuits 106_3 and 106_4, the monitor lines MTR1 and MTR2 may provide a touch detection voltage to the anode terminals of the light-emitting diodes OLD of the pixel circuits 106_3 and 106_4, and the power lines PWR1, PWR2 may provide, corresponding to the touch detection voltage, a touch sensing voltage to the touch sensing circuit TSC. For example, when a touch occurs on the light-emitting diode OLD of the pixel circuit 106_3, the power line PWR1 may correspondingly provide a touch sensing voltage to the touch sensing circuit TSC, so that the touch sensing circuit TSC learns a position (for example, on the light-emitting diode OLD of the pixel circuit 106_1) where the touch occurs at this time (when the transistors T3 of the pixel circuits 106_3 and 106_4 are turned on), and accordingly acquire the coordinates of the touch that occurs.

Figure 3A:
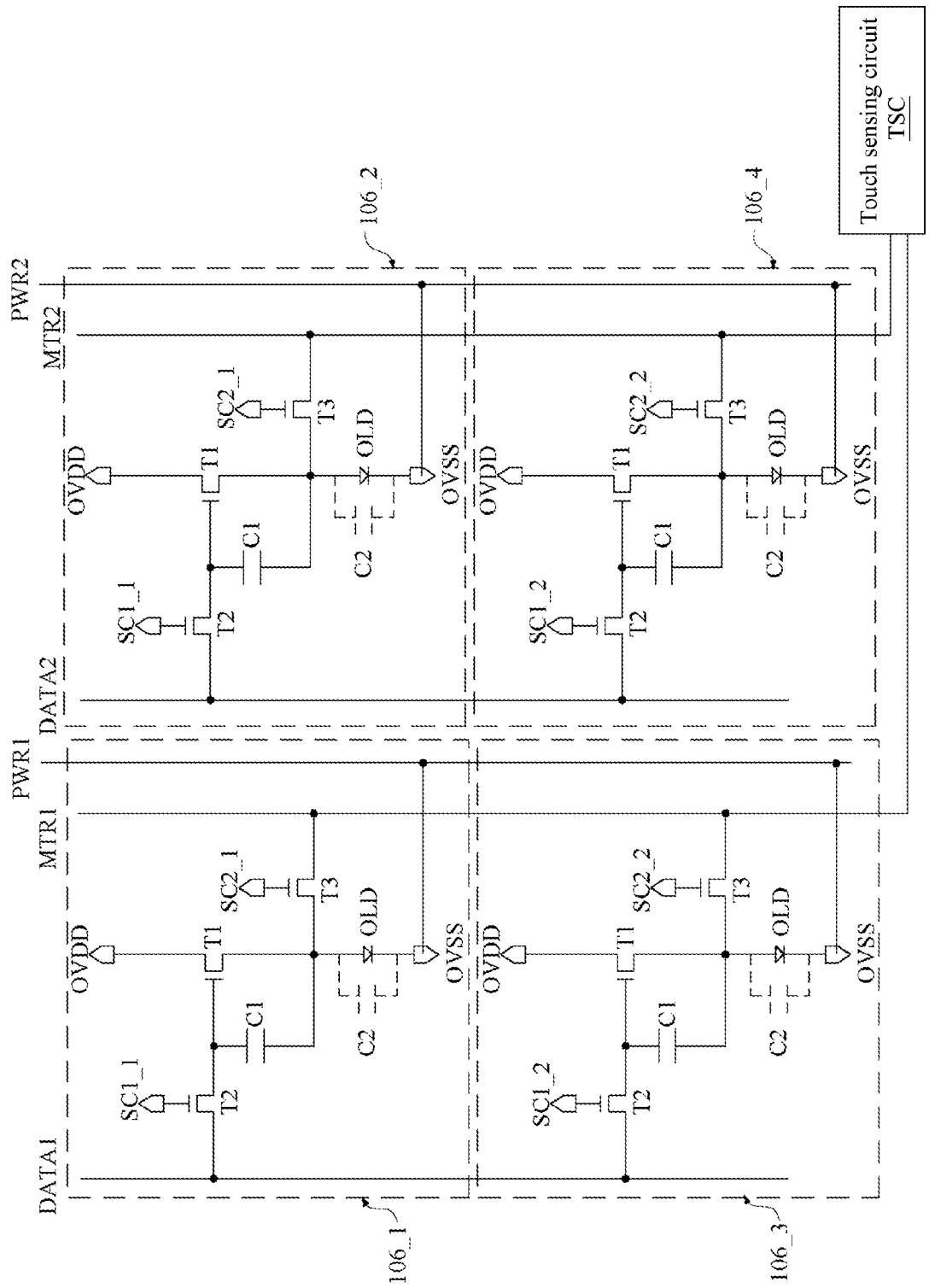
FIG. 3A is a schematic diagram of multiple pixel circuits according to another embodiment of the present invention.

For another example, referring to FIG. 3A (in this example for description, the touch sensing circuit TSC is electrically coupled to the monitor lines MTR1 and MTR2), when the scanning signal SC2_1 turns on the transistors T3 of the pixel circuits 106_1 and 106_2 and the scanning signal SC2_2 turns off the transistors T3 of the pixel circuits 106_3 and 106_4, the power lines PWR1, PWR2 may provide a touch detection voltage to the cathode terminals of the light-emitting diodes OLD of the pixel circuits 106_1 and 106_2, and the monitor lines MTR1 and MTR2 may provide, corresponding to the touch detection voltage, a touch sensing voltage to the touch sensing circuit TSC. For example, when a touch occurs on the light-emitting diode OLD of the pixel circuit 106_1, the monitor line MTR1 may correspondingly provide a touch sensing voltage to the touch sensing circuit TSC, so that the touch sensing circuit TSC learns a position (for example, on the light-emitting diode OLD of the pixel circuit 106_1) where the touch occurs at this time (when the transistors T3 of the pixel circuits 106_1 and 106_2 is turned on), and accordingly acquire the coordinates of the touch that occurs.

In addition, when the scanning signal SC2_1 turns off the transistors T3 of the pixel circuits 106_1 and 106_2 and the scanning signal SC2_2 turns on the transistors T3 of the pixel circuits 106_3 and 106_4, the power lines PWR1, PWR2 may provide the touch detection voltage to the cathode terminals of the light-emitting diodes OLD of the pixel circuits 106_3 and 106_4 and the monitor lines MTR1 and MTR2 may provide, corresponding to the touch detection voltage, a touch sensing voltage to the touch sensing circuit TSC. For example, when a touch occurs on the light-emitting diode OLD of the pixel circuit 106_3, the monitor line MTR1 may correspondingly provide a touch sensing voltage to the touch sensing circuit TSC, so that the touch sensing circuit TSC learns a position (for example, on the light-emitting diode OLD of the pixel circuit 106_1) where the touch occurs at this time (when the transistors T3 of the pixel circuits 106_3 and 106_4 are turned on), and accordingly acquire the coordinates of the touch that occurs.

By means of the foregoing disposition, a capacitor may be formed via a light-emitting diode OLD, so as to perform touch sensing, and a capacitor does not need to be additionally disposed.

Figure 4:
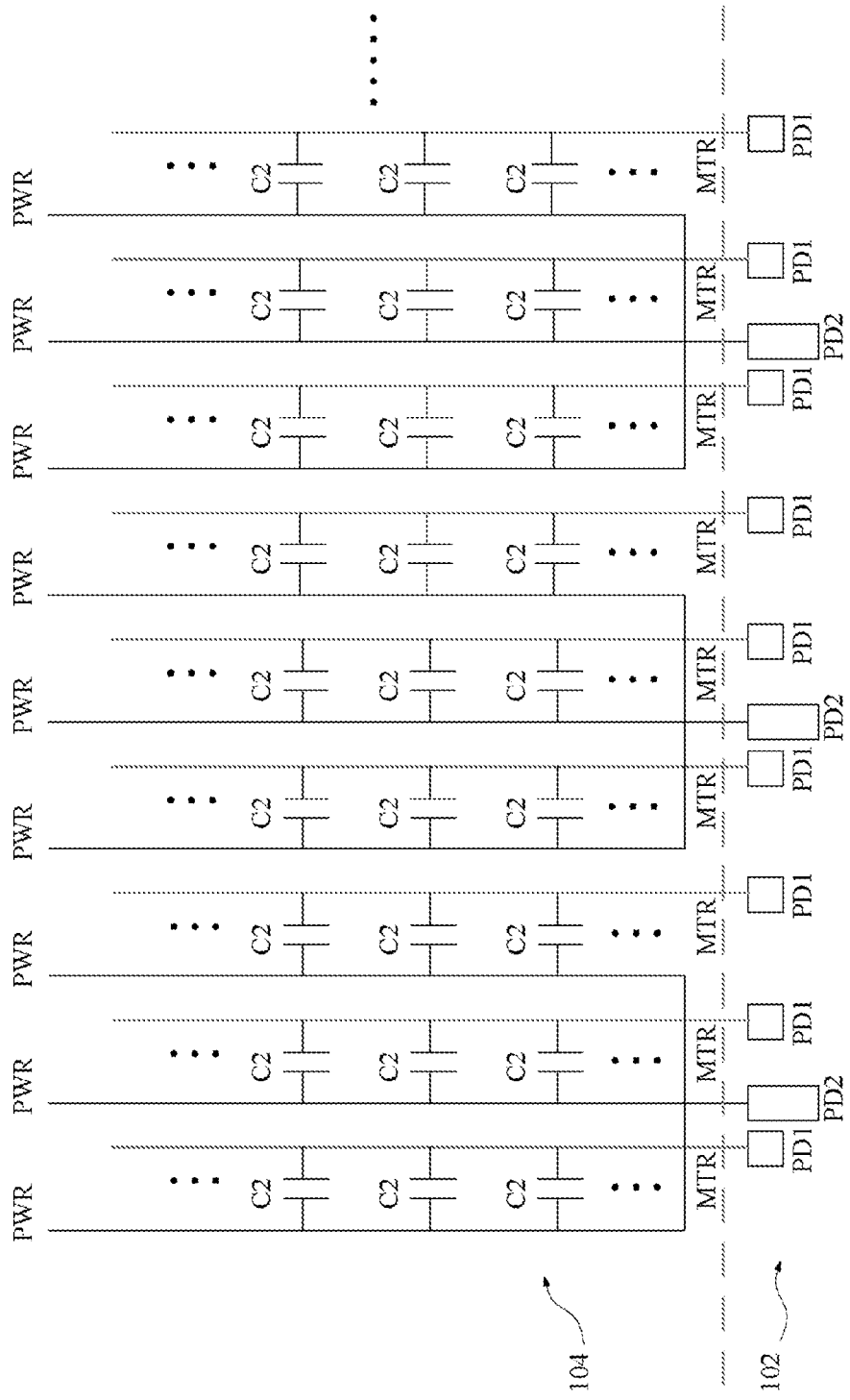
FIG. 4 is a schematic diagram of a contact pad, a power line, and a monitor line according to an embodiment of the present invention.

Refer to FIG. 4. FIG. 4 is obtained by simplifying FIG. 3 and further shows a positional relationship and a coupling relationship between a PWR and an MTR. In an embodiment, multiple power lines PWR (for example, 3 power lines PWR) may form one group, and are electrically coupled to each other and electrically coupled to a single contact pad PD2. In addition, each monitor line MTR is electrically coupled to a single contact pad PD1.

In an embodiment, during the display operation, multiple contact pads PD2 may be electrically coupled to each other, so as to provide the same supply voltage OVSS to the pixel circuits 106/106a. In an embodiment, during a touch sensing operation, the contact pad PD1 may receive the touch detection voltage from the touch detection circuit TDC, and provide the touch detection voltage to a row of capacitors C2 through the monitor line MTR (that is, the capacitors C2 that are formed in the light-emitting diodes OLD of a row of the pixel circuits 106/106a). The contact pad PD2 may receive the touch sensing voltage from the row of capacitors C2, and provide the touch sensing voltage to the touch sensing circuit TSC. In another embodiment, during a touch sensing operation, the contact pad PD2 may receive the touch detection voltage from the touch detection circuit TDC, and provide the touch detection voltage to the row of capacitors C2 (that is, the capacitors C2 formed in the light-emitting diodes OLD of a row of the pixel circuits 106/106a) through the power lines PWR. The contact pad PD1 may receive the touch sensing voltage from each row of capacitors C2 sequentially, and provide the touch sensing voltage to the touch sensing circuit TSC.

Figure 5:
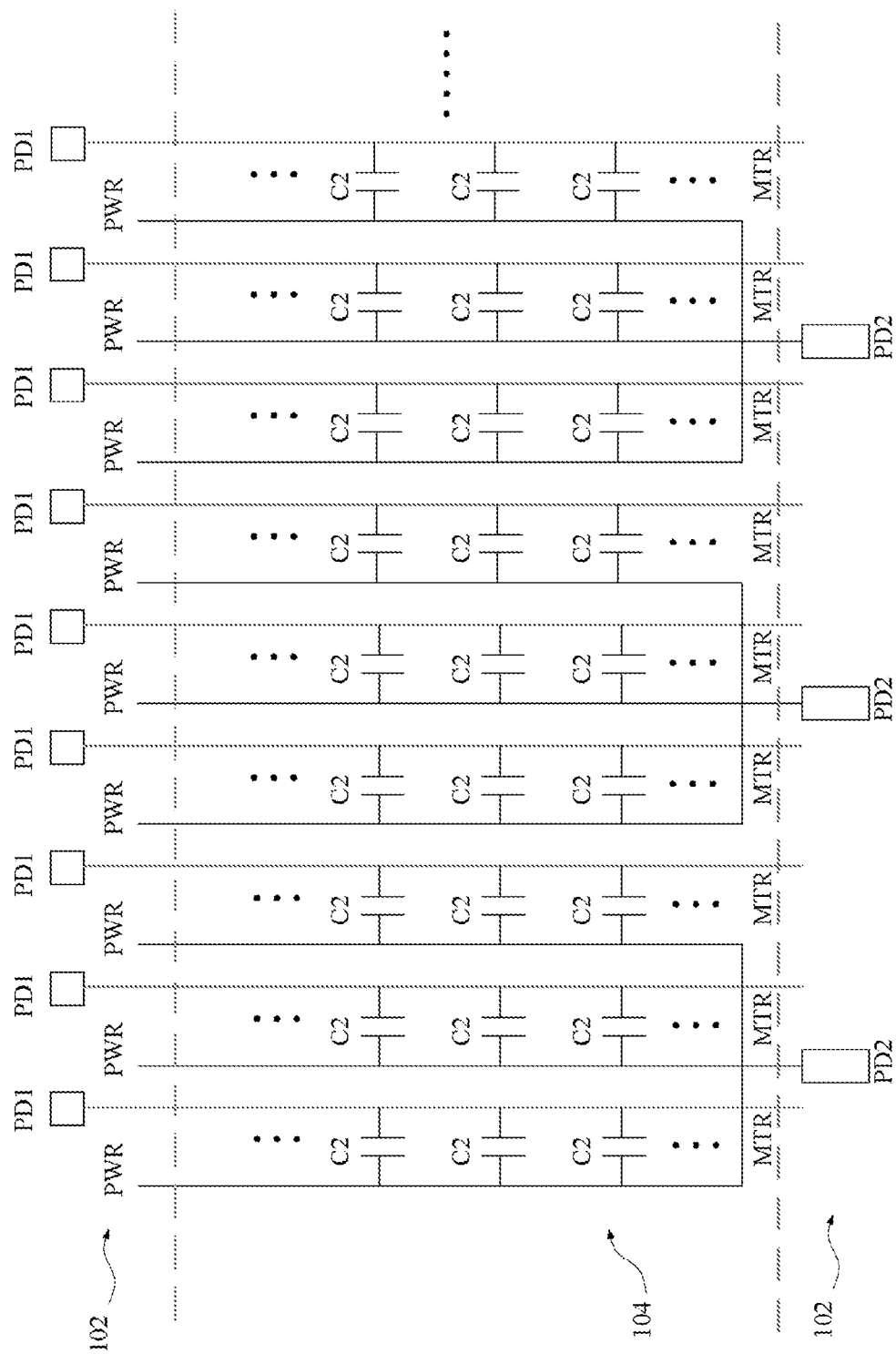
FIG. 5 is a schematic diagram of a contact pad, a power line, and a monitor line according to another embodiment of the present invention.

In this embodiment, the contact pad PD1 and the contact pad PD2 may be disposed on a same side of the non-display area 102. However, the present invention is not limited thereto. In a different embodiment, the contact pad PD1 and the contact pad PD2 may be disposed on two opposite sides of the non-display area 102 (as shown in FIG. 5).

Refer to FIG. 6. FIG. 6 shows the structure of a pixel circuit 106a different from the pixel circuit 106. In an embodiment, either the pixel circuit 106 or the pixel circuit 106a may be applied to the display device. Alternatively, both the pixel circuits 106 and the pixel circuits 106a may be applied to the display device. In an embodiment, the pixel circuits 106a includes transistors T1a to T3a, a capacitor C1a, and a light-emitting diode OLD. The transistor T3a may be used as the control switch CTL, and the transistors T1a and T2a and the capacitor C1a may be used as the driving circuit DRV.

In this embodiment, a first terminal of the transistor T1a is electrically coupled to the cathode terminal of the light-emitting diode OLD, and a second terminal of the transistor T1a is used to receive a supply voltage OVSS.

In this embodiment, a first terminal of the transistor T2a is electrically coupled to a data line DATA, a second terminal of the transistor T2a is electrically coupled to a control terminal of the transistor T1a, and a control terminal of the transistor T2a is used to receive a scanning signal SCN. The scanning signal SCN may be provided by one of the gate lines G(1), G(2), . . . , and G(N).

In this embodiment, a first terminal of the transistor T3a is electrically coupled to a second terminal of the transistor T1a, a second terminal of the transistor T3a is used to be electrically coupled to the monitor line MTR, and a control terminal of the transistor T3a is used to receive the scanning signal SCN. In this embodiment, the transistor T3 may be used as a control switch, and is used to control touch sensing.

In this embodiment, two ends of the capacitor C1a are electrically coupled to the control terminal of the transistor T1a and the second terminal of the transistor T1a, respectively. In this embodiment, the anode terminal of the light-emitting diode OLD is electrically coupled to the power lines PWR, and is used to receive a supply voltage OVSS during the display operation.

In this embodiment, a capacitor C2a may be formed between the monitor line MTR and the power line PWR via a light-emitting diode OLD, so as to perform touch sensing.

A touch sensing operation of the pixel circuits 106a is approximately similar to the touch sensing operation of the foregoing pixel circuits 106. Therefore, for corresponding details, refer to the foregoing paragraphs. Details are no longer elaborated herein.

Figure 7:
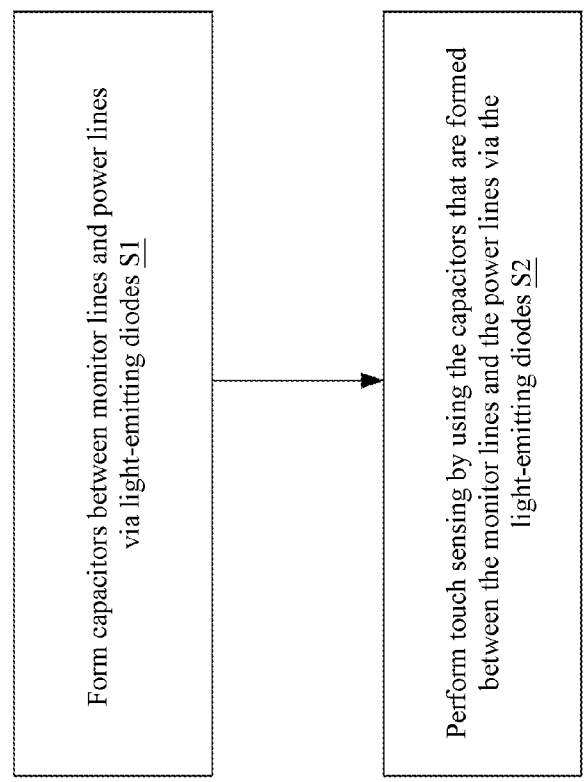
FIG. 7 is a flowchart of an operating method of a display device according to an embodiment of the present invention.

FIG. 7 is a flowchart of an operating method 200 of a display device according to an embodiment of the present invention.

It should be noted that the operating method 200 may be applied to a display device having a structure that is the same as or similar to that shown in FIG. 1. For ease of description, according to an embodiment of the present invention, the display device 100 in FIG. 1 is used as an example to describe the operating method 200 below. However, the present invention is not limited to this application.

In addition, it should be understood that besides operations of which an order is specifically indicated, an order of operations of the operating method 200 discussed in this implementation manner may be adjusted according to actual requirements, or all or some of the operations may even be performed at the same time.

Moreover, in a different embodiment, these operations may be adaptively added, replaced, and/or omitted.

In this embodiment, the operating method 200 includes the following operations. In an operation S1, the display device 100 forms capacitors between monitor lines M(1), M(2), . . . , and M(M) and power lines P(1), P(2), . . . , and P(M) via light-emitting diodes OLD.

In an operation S2, the display device 100 performs touch sensing by using the capacitors that are formed between the monitor lines M(1), M(2), . . . , and M(M) and the power lines P(1), P(2), . . . , and P(M) via the light-emitting diodes OLD.

It should be noted that, for details of the foregoing operations, refer to the foregoing paragraphs. Details are no longer elaborated herein.

By means of the foregoing operations, a capacitor may be formed via a light-emitting diode OLD, so as to perform touch sensing, and a capacitor does not need to be additionally disposed.

Although the present invention is disclosed as above by using the embodiments, the embodiments are not used to limit the present invention. Any person skilled in the art may make variations and modifications without departing from the spirit and scope of the present invention, and therefore the protection scope of the present invention should be as defined by the appended claims.

What is claimed is:

1. A display device, comprising:
a plurality of light-emitting diodes, arranged in a matrix;
a plurality of control switches, arranged in the matrix, and electrically coupled to a plurality of first terminals of the light-emitting diodes, respectively;
a plurality of monitor lines, electrically coupled to the first terminals of the light-emitting diodes through the control switches, respectively;
a plurality of power lines, electrically coupled to a plurality of second terminals of the light-emitting diodes, respectively; and
a touch sensing circuit, electrically coupled to the light-emitting diodes, and used to receive one or more touch sensing voltages by using the first terminals or the second terminals of the light-emitting diodes;
wherein a plurality of capacitors is formed between the monitor lines and the power lines via the light-emitting diodes, wherein a monitor line of the plurality of monitor lines is used to receive a plurality of touch detection voltages from a touch detection circuit, and provides the touch detection voltages to the first terminals or the second terminals of the light-emitting diodes, and a power line of the plurality of power lines is used to provide, corresponding to the touch detection voltages, the one or more touch sensing voltages to the touch sensing circuit.

2. The display device according to claim 1, wherein when a row of the control switches are turned on, the first terminals or the second terminals of the light-emitting diodes corresponding to the row of the control switches that are turned on receive a plurality of touch detection voltages.

3. The display device according to claim 1, wherein the monitor lines are parallel to the power lines.

4. The display device according to claim 1, further comprising:
a plurality of first contact pads, disposed on a first side of a non-display area of the display device, and electrically coupled to the monitor lines; and
a plurality of second contact pads, disposed on the first side of the non-display area of the display device or a second side of the non-display area opposite the first side, and electrically coupled to the power lines.

5. The display device according to claim 1, wherein the plurality of power lines are electrically coupled to each other.

6. A display device, comprising:
a plurality of light-emitting diodes, disposed in a display area of the display device;
a plurality of control switches, disposed in the display area of the display device, and electrically coupled to a plurality of first terminals of the light-emitting diodes, respectively;

a plurality of monitor lines, disposed in parallel to each other, and electrically coupled to the first terminals of the light-emitting diodes through the control switches, respectively;

a plurality of power lines, disposed in parallel to each other, and electrically coupled to a plurality of second terminals of the light-emitting diodes, respectively;

a plurality of first contact pads, disposed in a non-display area of the display device, and electrically coupled to the monitor lines;

a plurality of second contact pads, disposed in the non-display area of the display device, and electrically coupled to the power lines; and a touch sensing circuit, electrically coupled to the light-emitting diodes, and used to receive one or more touch sensing voltages by using the first terminals or the second terminals of the light-emitting diodes;

wherein a plurality of capacitors is formed between the monitor lines and the power lines via the light-emitting diodes, wherein a monitor line of the plurality of monitor lines is used to receive a plurality of touch detection voltages from a touch detection circuit, and provides the touch detection voltages to the first terminals or the second terminals of the light-emitting diodes, and a power line of the plurality of power lines is used to provide, corresponding to the touch detection voltages, the one or more touch sensing voltages to the touch sensing circuit.

7. The display device according to claim 6, wherein the first contact pads are disposed on a first side of the non-display area, and the second contact pads are disposed on the first side of the non-display area or a second side of the non-display area opposite the first side.

8. The display device according to claim 6, wherein the plurality of power lines are electrically coupled to each other.

9. An operating method of a display device, comprising:
forming a plurality of capacitors between a plurality of monitor lines of the display device and a plurality of power lines of the display device via a plurality of light-emitting diodes;

performing touch sensing by using the capacitors, wherein
the light-emitting diodes are arranged in a matrix,
a plurality of control switches of the display device is arranged in the matrix, and electrically coupled to a plurality of first terminals of the light-emitting diodes, respectively;
the monitor lines are electrically coupled to the first terminals of the light-emitting diodes, respectively; and
the power lines are electrically coupled to a plurality of second terminals of the light-emitting diodes, respectively;

receiving a plurality of touch detection voltages from a touch detection circuit by using a monitor line of the plurality of monitor lines, and providing the touch detection voltages to the first terminals or the second terminals of the light-emitting diodes; and providing, corresponding to the touch detection voltages, one or more touch sensing voltages to a touch sensing circuit by using a power line of the plurality of power lines.

10. The operating method according to claim 9, wherein receiving the touch detection voltages comprises: turning on a row of the control switches, and receiving the touch detection voltages by using the first terminals or the second terminals of the light-emitting diodes corresponding to the row of the control switches that are turned on.

11. The operating method according to claim 10, wherein providing the touch sensing voltages to the touch sensing circuit comprises: when a touch occur on one or more of the light-emitting diodes, by using one or more of the power lines or one or more of the monitor lines electrically coupled to the light-emitting diodes corresponding to the touch, outputting, corresponding to the touch detection voltages, the one or more touch sensing voltages.

* * * * *